(12) United States Patent
Zhang et al.

(10) Patent No.: US 9,335,206 B2
(45) Date of Patent: May 10, 2016

(54) WAVE FRONT ABERRATION METROLOGY OF OPTICS OF EUV MASK INSPECTION SYSTEM

(71) Applicant: KLA-Tencor Corporation, Milpitas, CA (US)

(72) Inventors: Qiang Zhang, Fremont, CA (US); Yanwei Liu, Danville, CA (US); Abdurrahman Sezginer, Monte Serano, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 45 days.

(21) Appl. No.: 14/010,484

(22) Filed: Aug. 26, 2013

(65) Prior Publication Data

US 2014/0063490 A1   Mar. 6, 2014

Related U.S. Application Data

(60) Provisional application No. 61/694,919, filed on Aug. 30, 2012.

(51) Int. Cl.
| | |
|---|---|
| *G01J 1/00* | (2006.01) |
| *G01J 1/42* | (2006.01) |
| *G21K 7/00* | (2006.01) |
| *G02B 5/08* | (2006.01) |

(52) U.S. Cl.
CPC ............ *G01J 1/00* (2013.01); *G01J 1/4257* (2013.01); *G02B 5/0833* (2013.01); *G02B 5/0891* (2013.01); *G21K 7/00* (2013.01)

(58) Field of Classification Search
CPC ............ G03F 7/70283; G03F 7/70308; G03F 7/70358
USPC .............................. 356/121–125; 10/121–125
See application file for complete search history.

(56) References Cited

U.S. PATENT DOCUMENTS

| | | | | |
|---|---|---|---|---|
| 8,559,108 | B2* | 10/2013 | Kruizinga | ............ G02B 5/1838 359/350 |
| 2002/0014403 | A1 | 2/2002 | Hoshino | |
| 2002/0171922 | A1* | 11/2002 | Shiraishi | .................. G02B 5/08 356/305 |
| 2006/0057476 | A1 | 3/2006 | Wasson et al. | |
| 2007/0188746 | A1 | 8/2007 | Kraus et al. | |
| 2010/0301437 | A1 | 12/2010 | Brown | |
| 2012/0066652 | A1 | 3/2012 | Clifford | |

OTHER PUBLICATIONS

"Hartmann Wavefront Analyzer Tutorial", Spiricon, Inc., Part No. 10885-001, Rev. D HWA Version 1.33, 2004, 19 pgs.
"International Application No. PCT/US2013/057147, Search Report and Written Opinion mailed Nov. 27, 2013", 13 pgs.

* cited by examiner

*Primary Examiner* — Kara E Geisel
*Assistant Examiner* — Iyabo S Alli
(74) *Attorney, Agent, or Firm* — Kwan & Olynick LLP

(57) ABSTRACT

Disclosed is test structure for measuring wave-front aberration of an extreme ultraviolet (EUV) inspection system. The test structure includes a substrate formed from a material having substantially no reflectivity for EUV light and a multilayer (ML) stack portion, such as a pillar, formed on the substrate and comprising a plurality of alternating pairs of layers having different refractive indexes so as to reflect EUV light. The pairs have a count equal to or less than 15.

25 Claims, 8 Drawing Sheets

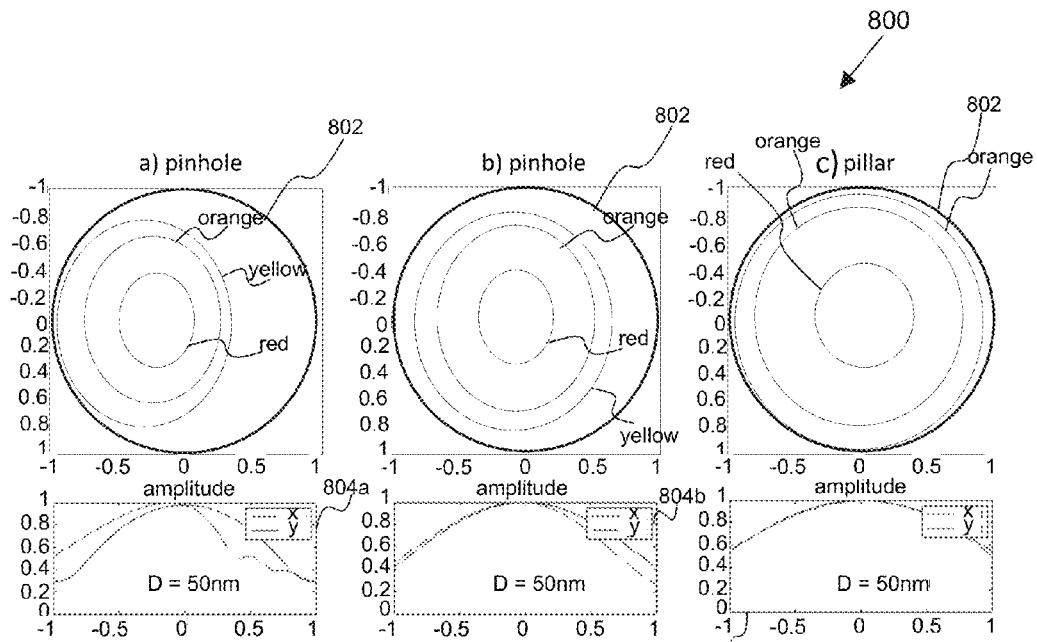
*Figure 8A*  *Figure 8B*  *Figure 8C*
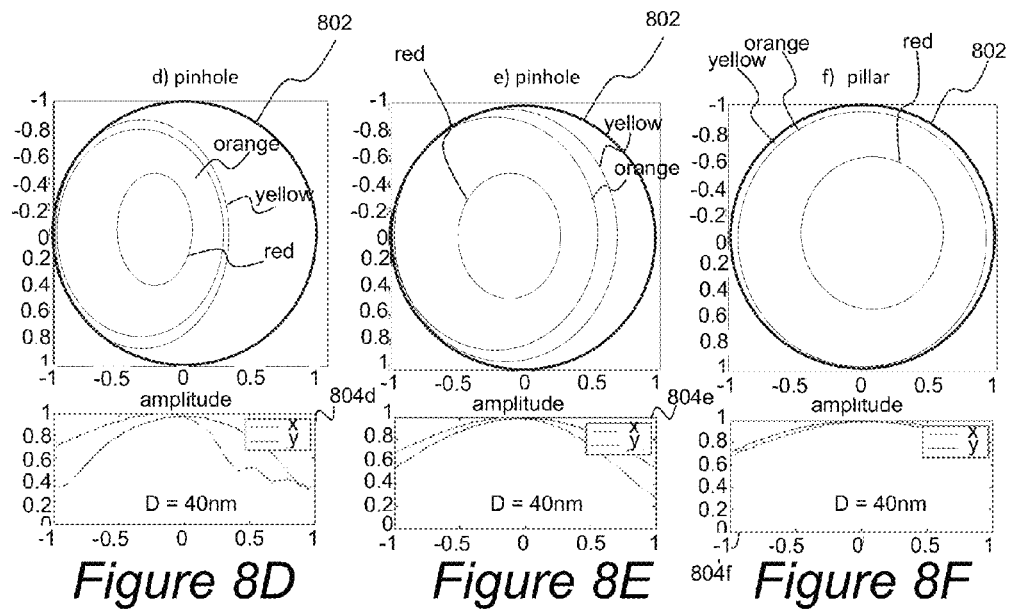
*Figure 8D*  *Figure 8E*  *Figure 8F*

WAVE FRONT ABERRATION METROLOGY OF OPTICS OF EUV MASK INSPECTION SYSTEM

CROSS-REFERENCE TO RELATED APPLICATION

This application claims priority of U.S. Provisional Patent Application No. 61/694,919, entitled "Test Mask for In-Situ Wave Front Aberration Metrology of Projection Optics for EUV Actinic Photomask Inspection", filed 30 Aug. 2012 by Qiang Zhang et al., which application is incorporated herein by reference in its entirety for all purposes.

TECHNICAL FIELD OF THE INVENTION

The invention generally relates to the field of extreme ultra violet (EUV) reticle inspection and metrology systems. More particularly the present invention relates to wave front metrology for EUV inspector systems.

BACKGROUND

Generally, the industry of semiconductor manufacturing involves highly complex techniques for fabricating integrated circuits using semiconductor materials which are layered and patterned onto a substrate, such as silicon. An integrated circuit is typically fabricated from a plurality of reticles or masks. Initially, circuit designers provide circuit pattern data, which describes a particular integrated circuit (IC) design, to a reticle production system, which transforms the pattern data into a plurality of reticles. One emerging type of reticle is an extreme ultraviolet (EUV) reticle that is comprised of a plurality of mostly reflecting layers and a patterned absorber layer.

Due to the large scale of circuit integration and the decreasing size of semiconductor devices, the reticles and fabricated devices have become increasingly sensitive to defects. These defects, if uncorrected, can cause the final device to fail to meet the desired performance due to electrical timing errors. Even worse, such defects can cause the final device to malfunction and adversely affect yield.

It would be beneficial to provide improved test devices, apparatus, and techniques to facilitate inspection of EUV reticles.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

A test structure for measuring wave-front aberration of an extreme ultraviolet (EUV) inspection system is disclosed. The test structure includes a substrate formed from a material having substantially no reflectivity for EUV light and a multilayer (ML) stack portion formed on the substrate and comprising a plurality of alternating pairs of layers having different refractive indexes so as to reflect EUV light. The ML stack portion is arranged on the substrate to expose a portion of the substrate. In certain embodiments, the pairs have a count equal to or less than 15. In another aspect, the count of the pairs is equal to or less than 10, and still others, less than 5.

In a specific implementation, each pair comprises (i) a molybdenum (Mo) layer and a silicon (Si) layer, (ii) a ruthenium (Ru) layer and a Si layer, or (iii) a Mo layer and a Si layer interfaced with a carbon (C) based barrier layer. In another aspect, the test structure includes a capping layer over the ML stack portion formed from a material that prevents oxidation of the ML stack portion and is substantially transparent. In another embodiment, the alternating pairs of layers of the ML stack portion are non-periodic and each alternating pair has a thickness that is optimized so that EUV light diffracted from the test structure substantially fills an entrance pupil area of the inspection system and/or has an optimized peak reflectivity.

In a specific example, a period of the ML stack portion is between about 7 and 7.5 nm. In another feature, the ML stack portion has a composition that provides a high contrast between the ML stack portion and the substrate when imaged with EUV light. In one embodiment, the ML stack portion has a thickness equal to or less than 75 nm. In another aspect, the substrate has a refractive index that results in reflectivity of EUV light that is less than 0.1%. In yet another implementation, the test structure includes a conformal layer over the ML stack portion's top and sidewalls, wherein the conformal layer has a low diffusivity for oxygen and is substantially transparent. In another aspect, the ML stack portion is a pillar and has a diameter less than 100 nm.

In an alternative embodiment, the invention pertains to a method of forming a test structure for measuring wave-front aberration of an extreme ultraviolet (EUV) inspection system. The method includes (i) depositing a plurality of alternating pairs of a first layer and a second layer that are reflective to EUV light, and (ii) patterning the plurality of alternating pairs of the first layer and the second layer to form a multilayer (ML) stack portion. The pairs of the first and second layers have a count equal to or less than 10.

In a specific implementation, the plurality of alternating pairs of the first and second layers are patterned by (i) forming a hard mask layer over the plurality of alternating pairs of the first and second layers; (ii) forming and exposing a photoresist material over the hard mask layer so as to form a resist pattern; (iii) with the resist pattern, etching the hard mask layer to form a hard mask pattern; (iv) with the hard mask pattern, etching the plurality of alternating pairs of the first and second layers to form the ML stack portion; and (v) removing the hard mask pattern. In a further aspect, the hard mask layer is chromium. In yet a further aspect, a chlorine/oxygen based chemistry is used to etch the hard mask layer. In another embodiment, a sulfur hexafluoride based chemistry is used to etch the plurality of alternating pairs of the first and second layers to form the ML stack portion. In another example, the plurality of alternating pairs of the first and second layers are patterned by using a focused ion beam to etch the plurality of alternating pairs of the first and second layer to form the ML stack portion.

In another embodiment, the method includes patterning the plurality of alternating pairs of the first layer and the second layer to form a plurality of ML stack portions. In this embodiment, the plurality of ML stack portions are formed by applying an electron beam photolithograph process and a subsequent etch process to the plurality of alternating pairs of a first layer and a second layer so as to form a plurality of ML pre-stack portions, and a focused ion beam photolithography is then performed on the ML pre-stack portions to form the ML stack portions, which have a smaller width than the ML pre-stack portions.

In another embodiment, a test structure has a substrate, multiple alternating pairs of layers having different refractive indexes so as to reflect EUV light, wherein the pairs have a count equal to or less than 15, and an absorber layer formed over the plurality of alternating pairs of layers. The absorber layer has a hole formed therein to expose a portion of the underlying plurality of alternating pairs of layers. In a further aspect, the absorber layer is comprised of tantalum nitride (TaN), chromium (Cr), platinum (Pt), or nickel (Ni). In another example, the absorber layer has a thickness that is equal to or less than about 100 nm.

In another embodiment, the invention pertains to an inspection system that includes one or more illumination elements for directing an EUV incident beam onto a test structure comprising a substrate formed from a material having substantially no reflectivity for EUV light and a multilayer (ML) stack portion formed on the substrate and comprising a plurality of alternating pairs of layers having different refractive indexes so as to reflect EUV light, wherein the pairs have a count equal to or less than 15. The system also includes one or more imaging elements for detecting an output beam from the test structure and generating an image or signal based on the output beam, wherein the output beam emanates from the test structure in response to the incident beam on the test structure, and a processor configured for analyzing the image or signal to measure wave-front aberration substantially across a pupil of the inspection system. In one aspect, the system has a numerical aperture (NA) greater than 0.1. In other examples, the test structure includes any one or more of the above features.

These and other aspects of the invention are described further below with reference to the figures.

BRIEF DESCRIPTION OF THE DRAWINGS

FIG. 8A-8F illustrate various pupil images formed with ML pillar or pinhole test structure embodiments of the present invention.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

Introduction

Figure 1A:
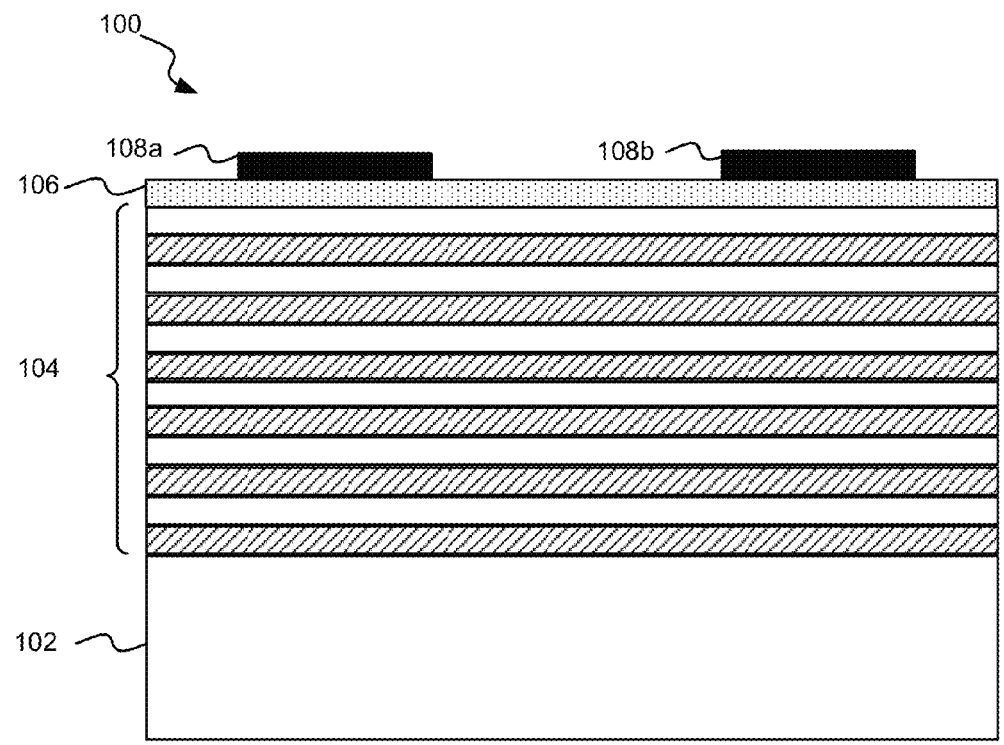
FIG. 1A is a diagrammatic representation of a side view of an example EUV reticle.

An extreme ultraviolet (EUV) lithography process typically uses an EUV type reticle that is designed to facilitate patterning on a wafer at EUV wavelengths, such as 13.5 nm. FIG. 1A is a diagrammatic representation of a side view of a portion of an example of an EUV reticle that may be used to fabricate a semiconductor wafer pattern. As shown, the EUV reticle 100 may include a substrate 102, such a low thermal expansion (LTE) or ultra-low expansion (ULE) glass plate.

The substrate is covered with multiple layers 104 of materials to provide moderate reflectance (e.g., 60-70% or more) at the EUV wavelength for performing lithographic exposure at EUV wavelengths. The multilayer stack 104 serves as a Bragg reflector that maximizes the reflection of EUV radiation while being a poor absorber of the EUV radiation. Reflection generally occurs at interfaces between materials of different indices of refraction with higher differences causing more reflectivity. Although indices of refraction for materials exposed to wavelengths that are extremely low are about equal to 1, significant reflection can be achieved through use of multiple layers having alternating layers of different refractive indices. The multilayer stack also may be comprised of low absorption characteristics so that the impinging radiation is reflected with little loss. In fabrication reticles, the multiple layers 104 may include between about 30 to 40 (or 40 to 50) alternating pairs of molybdenum (Mo) and silicon (Si) layers arranged with about 7 nanometer pitch.

The multiple layers 104 may be covered with a capping layer 106, such as Ru, to prevent oxidation of the underlying ML reflector layer. In other embodiments, an EUV reticle may include a quartz, antireflective coating (ARC) for deep UV (DUV), and other features. A pattern (e.g., 108a and 108b) is formed in an absorber layer that is disposed over the multiple layers 104. For example, a tantalum boron nitride film topped by a thin anti-reflective oxide acts as a EUV absorber. The material(s) used for the reticle pattern may be selected to have nearly zero etch bias so as to achieve ultra-fine resolution features.

Figure 1B:
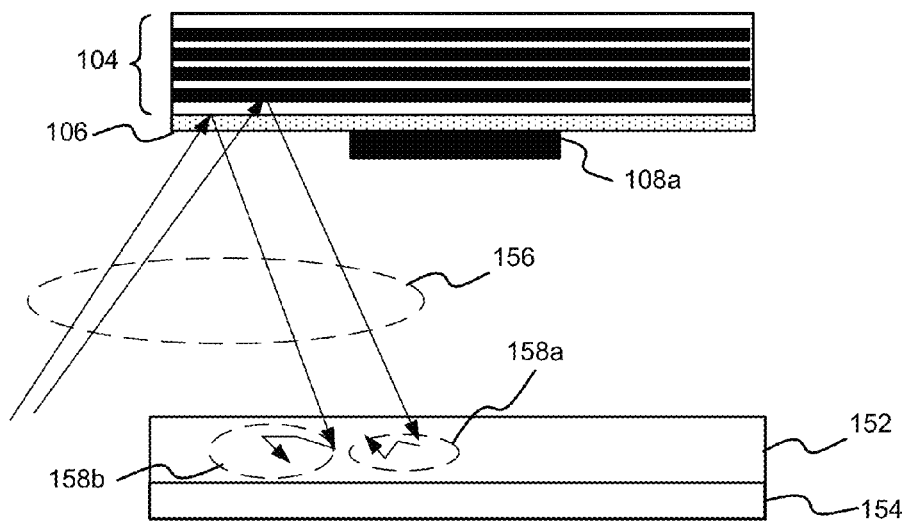
FIG. 1B illustrates a side view perspective of an EUV reticle and wafer in an EUV photolithography process.

In general, any suitable EUV photolithography process may be implemented to expose a photoresist layer on a wafer via a EUV reticle. FIG. 1B illustrates a side view perspective of a reticle and a wafer sample in a EUV photolithography process. The light source of a photolithography system may produce any suitable radiation that is suitable for use with EUV reticles. For instance, EUV wavelengths between about 11 to 14 nm or lower soft x-ray wavelengths may be utilized. In a specific implementation, a wavelength of about 13.5 nm is produced.

During photolithography, radiation 156 that is reflected from the multiple layers 104 of a EUV reticle is absorbed in a resist layer 152 formed on a wafer substrate 154. The absorbed radiation produces photoacids (H+) and amplified photoacids (e.g., 158a and 158b) that form an exposed pattern in the resist layer 152 of the wafer substrate 154 that corresponds to the absorber pattern layer, e.g., 108a, of the EUV reticle when the photo resist is developed. Reflective imaging optics between the EUV reticle and the wafer is omitted in FIG. 1B for clarity.

Inspection System Examples

Figure 2:
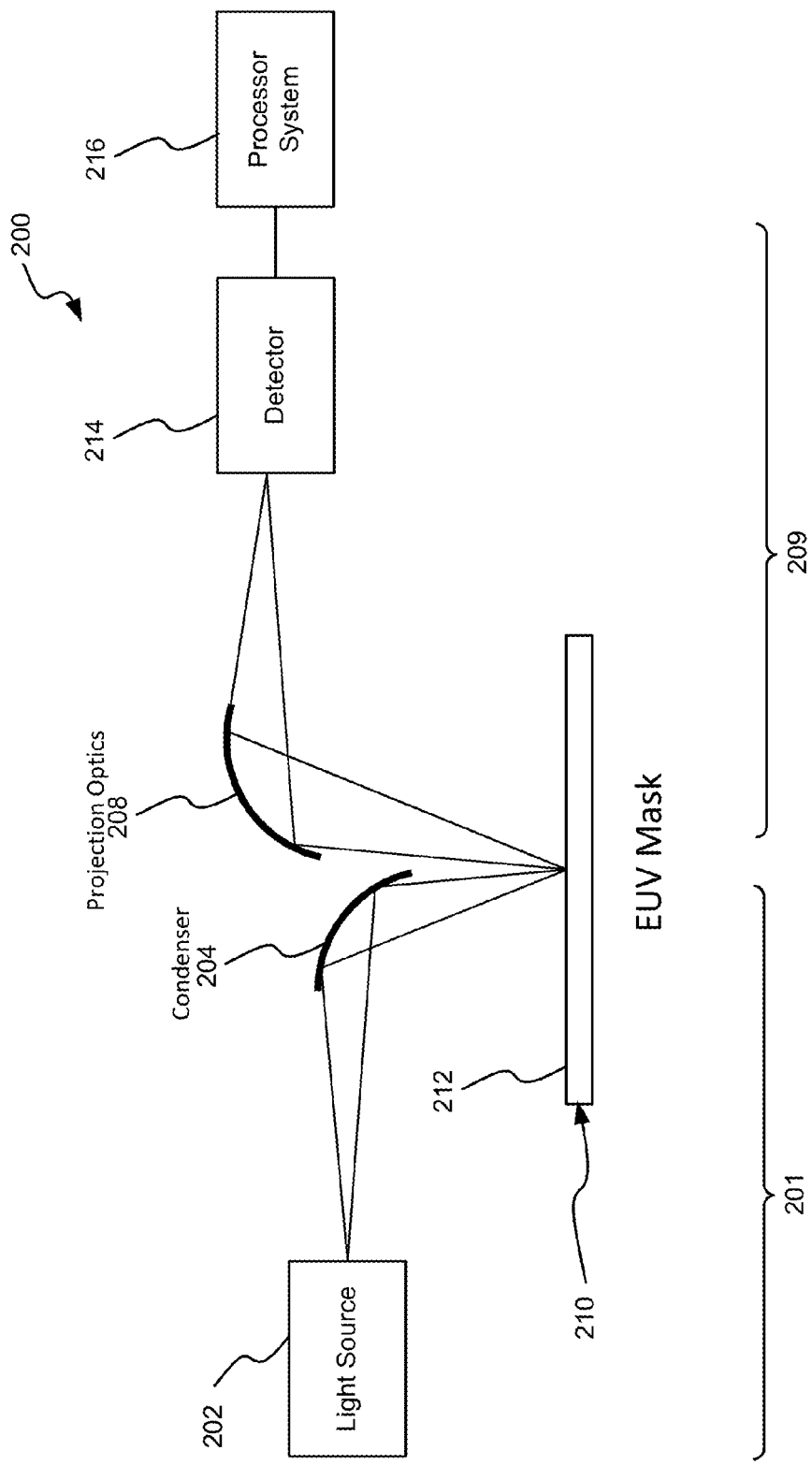
FIG. 2 is a diagrammatic representation an actinic inspection tool in which techniques of the present invention may be implemented.

FIG. 2 is a diagrammatic representation an EUV actinic inspection tool 200 in which techniques of the present invention may be implemented. The inspection tool 200 may generally include one or more illumination elements 201 for directing an EUV incident beam onto a test structure, as described further herein, and one or more imaging elements 209 for detecting an output beam from the test structure and generating an image or signal based on the output beam. The output beam emanates from the test structure in response to the incident beam on the test structure.

In the illustrated example, the illumination elements 201 may include a light source 202 that is suitable for inspection of an EUV reticle. One example of a light source is a quasi-continuous wave laser. In certain embodiments, a light source may generally provide high pulse repetition rate, low-noise, high power, stability, reliability, and extendibility.

The illumination elements 201 may also include a beam steering device for precise beam positioning and a beam conditioning device, which can be used to provide light level control, speckle noise reduction, and high beam uniformity. Beam steering and/or beam conditioning devices may be separate physical devices from, for example, a laser.

An inspection system may include any suitable number and type of illumination elements 201 for directing and focusing an incident light beam onto the inspected surface 212. For brevity, FIG. 2 illustrates only condenser optics 204. However, one skilled in the art would understand that an inspection system can include other optical elements needed to achieve specific inspection functions.

The sample 210 may also be placed on a stage (not labeled) of the inspection system 200, and the inspection system 200 may also include a positioning mechanism for moving the stage (and sample) relative to the incident beam or moving any other components of the system 200. By way of examples, one or more motor mechanisms may each be formed from a screw drive and stepper motor, linear drive with feedback position, or band actuator and stepper motor.

After the incident beam(s) impinge on the sample 210, the light may then be reflected and scattered (or diffracted) from the sample 210 in the form of "output light" or an "output beam" (or multiple output beams). The inspection system also includes any suitable imaging optics arrangements for directing the output light towards one or more detectors. The imaging optics 209 (and/or illumination optics 201) can be adjusted to different sizes of pixels, e.g., less than about 100 nm for each pixel or, more particularly, less than about 75 nm or even less than 60 nm.

As shown, an output beam can be received by a detector 214 via projection optics 208. In certain embodiments, the detector 214 is a time delay integration (TDI) detector. A typical TDI detector accumulates multiple exposures of the same area of the inspected surface, effectively increasing the integration time available to collect incident light. The object motion may be synchronized with the exposures to ensure a crisp image. In general, a detector may include transducers, collectors, charge-coupled devices (CCDs) or other types of radiation sensors.

The illuminating light beam can be directed at the sample surface 212 at any suitable angles, such as normal and/or oblique angles. In these embodiments, an attenuator may be positioned on the output beam path in order to attenuate a zero order component of the scattered light beam prior to reaching a detector. Furthermore, an imaging aperture may be positioned on the output beam path to shift the phase of the zero order component of the output light beam. An illumination aperture may also be positioned on the illumination path to achieve various illumination profiles.

A detector is typically coupled with a processor system 216 or, more generally, to a signal processing device, which may include an analog-to-digital converter configured to convert analog signals from the detector 214 to digital signals for processing. The processor system 216 may be configured to analyze intensity, phase, wave front metrology characteristics, and/or other characteristics of one or more reflected beams. The processor system 216 may be configured (e.g., with programming instructions) to provide a user interface (e.g., a computer screen) for displaying a resultant image, measured signal, or other inspection characteristics. The processor system 216 may also include one or more input devices (e.g., a keyboard, mouse, joystick) for providing input. The processor system 216 may also be coupled with the stage for controlling, for example, a sample position (e.g., focusing and scanning) and other metrology or inspection parameters and configurations of the inspection system elements. In certain embodiments, the processor system 216 is configured to carry out wave front metrology techniques detailed herein.

The inspection tool may be generally operable to convert detected light into detected signals corresponding to intensity values. The detected signals may take the form of an electromagnetic waveform having amplitude values that correspond to different intensity values at different locations of the reticle. The detected signals may also take the form of a simple list of intensity values and associated reticle point coordinates. The detected signals may also take the form of an image having different intensity values corresponding to different positions or scan points on the reticle. An intensity image may be generated after all the positions of the reticle are scanned and converted into detected signals, or potions of an intensity image may be generated as each reticle portion is scanned with the final intensity image being complete after the entire reticle is scanned.

The inspection system may also include one or more inspection control and/or review stations for setting up the inspection system and reviewing the defect data, images, and maps. The inspection system typically may include one or more microprocessor integrated circuits and may also contain interface and/or memory integrated circuits and may additionally be coupled to one or more shared and/or global memory devices for storing the setup recipes and inspection results.

One or more components of the inspection system or review station may comprise a specially configured computer system that includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

The inspection apparatus 200 may be suitable for inspecting EUV reticles, as well as other semiconductor samples, such as devices, wafers, or other types of reticles. Other types of samples which may be inspected or imaged using the inspection apparatus of the present invention include any surface, such as a flat panel display.

In the above exemplary inspection systems, the incident beam may be in any suitable form of light. Additionally, any suitable lens arrangement may be used to direct the incident beam towards the sample and direct the output beam emanating from the sample towards a detector. The output beam may be reflected or scattered from the sample or transmitted through the sample, depending upon the particular inspection or metrology application. For EUV reticle inspection, the output beam is scattered from the sample. Likewise, any suitable detector type or number of detection elements may be used to receive the output beam and provide an image or a signal based on the characteristics (e.g., intensity) of the received output beam.

In certain inspection applications, different spatial portions of the incident light or detected light may be selectively diffracted off any suitable spatial aperture to produce any incident or detected light profile at any suitable incident angles. By way of examples, programmable illumination or detection apertures may be utilized to produce a particular beam profile, such as dipole, quadrapole, quasar, annulus, etc. In a specific example, pixelated illumination techniques may be implemented. Programmable illuminations and special apertures can serve the purpose of enhancing feature contrast for certain patterns on the reticle.

Wave Front Metrology

Although the optical components of the inspection system may initially be set up for inspection of a EUV reticle, the optical components may drift over time due to vibrational or thermal effects. This "wave-front" aberration will compromise imaging of the EUV reticle under inspection. Accordingly, the optics of the inspection tool for inspection an EUV reticle may require re-positioning so as to minimize drift of the optical wave front aberration.

Certain embodiments of the present invention provide a diagnostic photomask for measuring and monitoring wave-front aberration of the optics for actinic inspection of a EUV reticle or photomask. In particular, measuring this wave-front aberration utilizes the same set of illumination optics and imaging sensor of the EUV actinic inspection system that will be used to image fabrication EUV reticles. In order to measure the wave-front aberration in the optics for inspecting EUV reticles, this diagnostic mask is generally designed to work with EUV light so as to utilize the same optical elements that are used for EUV reticle inspection. Thus, in this measurement, the diagnostic mask resides in the same location where the photomasks to be inspected would be.

As all EUV photomasks are reflective in type, the diagnostic mask may be based on a reflective design as well. Alternatively, a membrane-like transmission type EUV photomask with pinhole test structures may be used, which may then use relay optical elements that could be shuttled in and out to route the illumination beam to the back side of the diagnostic mask. This shuttling of relay optical elements would trigger throughput loss and increase the cost and complexity of the inspection system. Furthermore, it may not always be feasible due to space limitation.

A number of issues may arise during wave-front metrology if the diagnostic mask was formed using characteristics similar to the EUV reticle patterns of a fabrication EUV mask as described above, for example, with respect to FIGS. 1 and 2. The multilayer reflector of a fabrication EUV mask is typically optimized to achieve high peak reflectivity for lithographic purposes, rather than to maximize its angular-bandwidth. Thus, measuring wave-front aberration using these type of masks is only suited for projection optics within inspection systems with a relatively small numerical aperture (NA), e.g., smaller than about 0.1 due to the ML reflector's angular-bandwidth limitation.

Additionally, it may be difficult to reach a balance of background suppression, feature resolution and image quality while measuring wave-front aberration using test features patterned into absorber materials. To achieve low intensity background, the thickness of the absorber material needs to be large. At the same time, thicker absorber increases the aspect ratio of the test feature, making it harder to pattern at fine resolution. Furthermore, a thicker absorber also degrades the optical image quality because of a shadowing and thick mask effect associated with the off-axis illumination of the EUV inspection system. An absorber layer also tends to have a non-zero EUV reflectivity, which may be large enough to interfere with aberration metrology Certain embodiments of the present invention provide a diagnostic test pattern that is designed to diffract EUV light intensity so as to substantially fill the pupil as uniformly as possible. Additionally, diagnostic mask embodiments include a test structure and surrounding background material that results in high contrast between the imaged test structure and imaged background.

The critical lateral dimension of the test pattern of the diagnostic mask may be designed to be comparable to or below the resolution of the projection optics. In one embodiment, the test pattern is equal to or less than a few tens of nanometers (nm). The diagnostic mask may also be designed to support lithographic patterning at such a fine resolution level while providing high optical resolution and contrast when the test structure is imaged under EUV light.

In one embodiment, the diagnostic mask is based on a thin EUV multilayer (ML) reflector design, composed of two alternating low-absorbing materials with high refractive index contrast. In contrast to the reflector seen on a fabrication reticle, which typically includes 40-60 pairs of Mo/Si bilayer, certain embodiments of the present invention employ no more than about 15 or no more than about 10, such as 5, pairs of Mo/Si bilayer. The result of using less than 10 bilayers or pairs of the ML portion 304 is that the bandwidth of the multilayer reflector 304 is significantly increased. Additionally, the thickness or period of the bilayer 304 (e.g., Mo/Si) may be tuned over the range of between about 7.0-7.5 nm, to further flatten out the reflectivity in the angular range of interest.

Figure 3A:
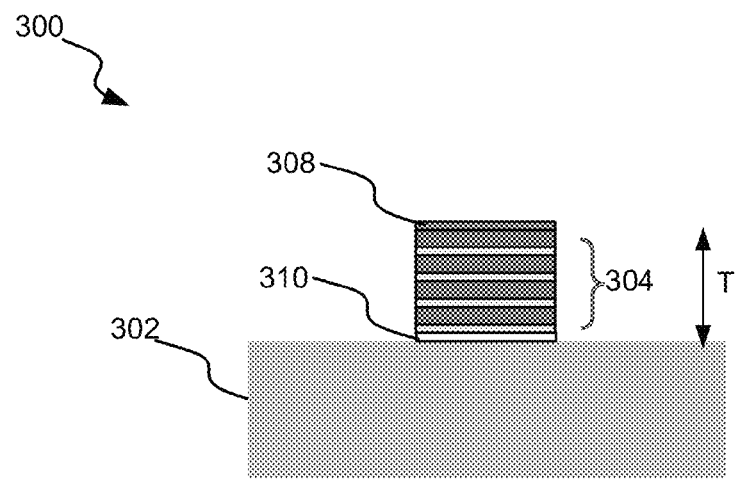
FIG. 3A is a diagrammatic side view of a diagnostic mask having a multilayer (ML) pillar structure for measuring EUV wave-front aberration in accordance with one embodiment of the present invention.
Figure 3B:
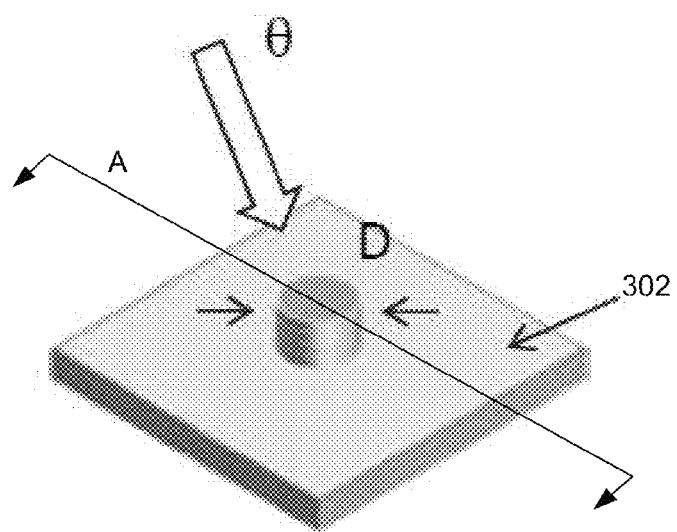
FIG. 3B is a perspective view of the ML pillar structure of FIG. 3A.

In a first embodiment, a ML stack portion, such as a pillar, is formed from a thin ML. FIG. 3A is a diagrammatic side view of a diagnostic mask having a ML pillar structure 300 for measuring EUV wave-front aberration in accordance with one embodiment of the present invention. FIG. 3B is a perspective view of the ML pillar structure 300 of FIG. 3A. FIG. 3A is a view along line A of Figure B. As shown, the ML pillar structure 300 comprises ML portion 304 on a substrate 302.

The substrate 302 may be generally formed from a material having a low reflectivity for EUV light (e.g., 13.5 nm), as compared with the resulting ML pillar structure 300, which is reflective. That is, the substrate may be formed from a material that minimizes reflectivity at EUV wavelengths, such as substantially transparent materials. For instance, the substrate may also have the same substrate as used in a fabrication EUV reticle, such as a low-thermal expansion material (LTEM). The substrate may be formed from other low reflective materials, such as glass or Si. The substrate may alternatively be formed from multiple layers, such as Si layer over a bulk quartz or glass layer. In one example, the substrate is formed from a material with a refractive index that is close to vacuum, resulting in reflectivity of EUV light that is less than 0.1%.

In contrast, the ML portion is formed from a high reflectivity material so as to result in a high contrast between the imaged ML pillar structure and the surrounding substrate. For instance, the ML portion 304 may be formed from any suitable reflective materials used in EUV applications, such as Molybdenum (Mo) and Silicon (Si), Ruthenium (Ru) and Si, a Mo layer and a Si layer interfaced with a carbon (C) based barrier layer etc.

A capping layer 308 may be deposited on top of the finished multilayer 304 to protect the multilayer 304 from moisture and oxygen attacks. In a specific implementation, the capping layer 308 has a thickness of a few nanometers. The capping layer 106 is also selected to be substantially transparent to EUV light. The capping layer may include Ruthenium (Ru), Si, diamond-like carbon (DLC), platinum (Pt), etc. This capping layer 308 is optional.

In this example, the ML pillar structure may have a thickness T that is comparable to or below the resolution of the projection optics. For example, the ML pillar structure has a thickness T that is equal to or less than a few tens of nanometers (nm), such as less than about 75 nm, or even less than about 50 nm. This thickness T may support patterning of the multilayer at a much finer lateral resolution D, similar to or even less than the multilayer thickness T.

Figure 4A:
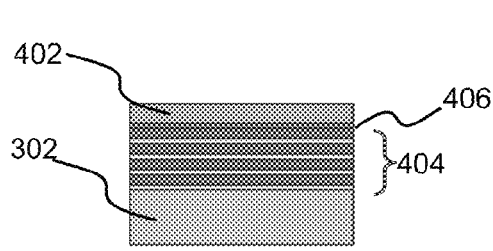
FIGS. 4A-4G illustrate a process for fabricating a ML pillar structure for measuring the wave-front aberration of a EUV inspection tool in accordance with a specific embodiment of the present invention.

The ML pillar structure 300 may be formed using any suitable fabrication technique. FIGS. 4A-4G illustrate a process for fabricating a ML pillar structure (ML pillar structure 300) for measuring the wave-front aberration of a EUV inspection tool in accordance with a specific embodiment of the present invention. FIG. 4A shows uniform multilayers (ML) 404, a capping layer 406, and a hard mask layer 402, which are uniformly deposited onto substrate 302. These layers can be formed by any suitable deposition processes for uniformly depositing such layers with thickness control. For example, each layer in the ML reflector 404, the capping layer 406, and the hard mask layer may be each deposited by ion-beam deposition or magnetron sputtering.

As shown, in FIG. 4A, a thin hard etch mask layer 402, such as chromium (Cr), can be formed uniformly on top of the multilayer (ML) reflector 404 (and capping layer 406). The hard mask material and thickness may be selected based on etching selectivity between the hard mask and the ML reflector 404 (and capping layer 406). That is, the hard mask can be selected to provide a good etch contrast, as compared to the ML reflector 404, for example, in a plasma etching process.

Figure 4B:
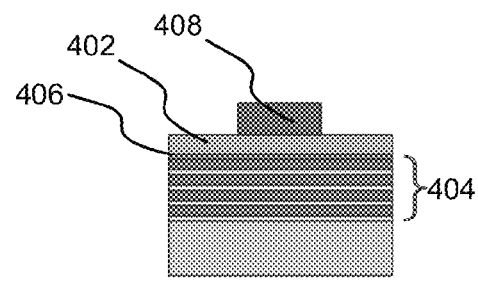

As shown in FIG. 4B, a lithography process may be used to form a resist pattern 408 on the hard mask 402. Any suitable lithography process may be used to expose the resist material to form the resist pattern. Example lithography processes include focused ion beam lithography, electron beam (e-beam) lithography, optical lithography, mask or maskless, etc.

Figure 4C:
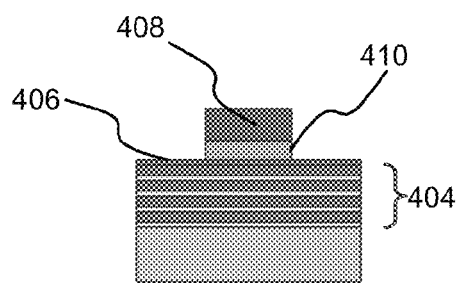
Figure 4D:
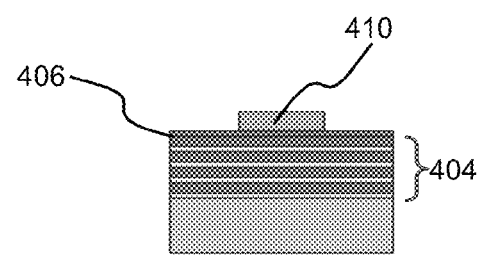

As shown in FIG. 4C, resist pattern 408 can be used to form an etched hard mask pattern 410, for example, during a plasma etching process. The etching chemistry may be tuned to etch only the hard mask 402. For example, chlorine/oxygen based chemistry for Cr may be used. The resist may or may not be stripped off after this.

Figure 4E:
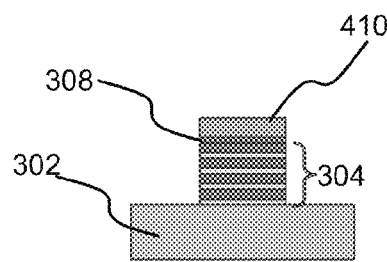
Figure 4F:
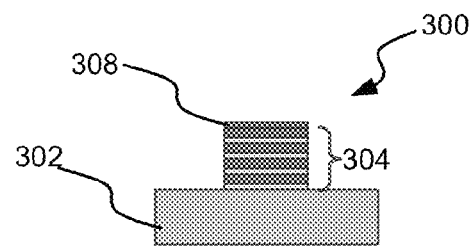

As shown in FIG. 4E, the ML pillar pattern may be subsequently transferred from the hard mask pattern 410 so as to form the ML pillar's reflector pattern 304 and capping pattern 308 using a second etching chemistry with high etch selectivity of the ML material over the hard mask material. One chemistry example may be based on sulfur hexafluoride, in the case of using Cr as the hard mask 410. The exposed ML reflector may be completely etched though into the substrate 302. As shown in FIG. 4F, the remaining hard mask 410 may be removed by a wet chemistry etchant.

Instead of using a hard mask, the photoresist pattern 408 may be used to etch the ML reflector directly. That is, the photoresist forms an etch mask. However, this resist etch mask may be totally consumed during the etching process so that the top of the ML reflector begins to be consumed too prior to forming a ML portion, such as a pillar. An etch recipe may be selected so as to quickly etch the ML reflector 404, while only slowly etching the resist layer 408. However, it is easier to find a recipe that only slowly etches the hard mask material (e.g., Cr) so it may be preferable to use a hard mask.

Figure 4G:
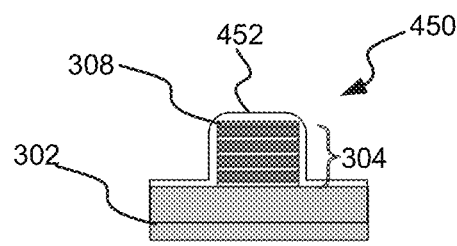

As shown in FIG. 4G, an alternative ML pillar structure 450 may be formed by the additional process of depositing a conformal layer 452 over the ML pillar structure after the ML reflector pattern (304) is etched. That is, the ML pattern 304 (and capping pattern 308 if present) could be conformally over-coated with a thin layer of material to protect the side walls and top of the ML structure from being oxidized. Such material may be selected to have a low diffusivity for oxygen and be relatively transparent at EUV wavelengths. Examples of such material include Ru, Boron (B), DLC, SiO2 and Si3N4. The capping layer 308 may or may not be used in conjunction with the conformal layer 452.

In an alternative embodiment, the ML reflector pattern 304 and capping pattern 308 may be etched using a focused ion beam without use of an etch mask (e.g., 410). That is, the process for forming the hard mask layer 402 (FIG. 4A) and forming the resist pattern 408 (FIG. 4B), etching of the hard mask layer 402 into a hard mask pattern 410 (FIG. 4C) may be skipped and replaced with a maskless focused ion beam (FIB) that etches the thin ML reflector 404 so as to directly form the ML pillar structure 300. However, a maskless lithography process may not be practical for etching a large array or a high number of test structures. To alleviate that drawback, a hybrid approach based on a combination e-beam lithography and plasma etching, as well as FIB etching, could be used. For example, e-beam lithography and plasma etch may be applied first to form a ML pillar structures with relatively large diameters. Then FIB etching is used to trim down the structures to the desirable size so as to minimize the amount of materials that have to be removed by FIB.

Figure 5:
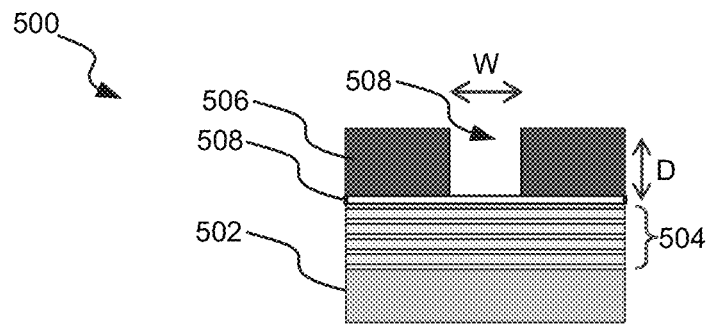
FIG. 5 is a side view representation of a pinhole structure for measuring the wave-front aberration of an EUV inspection tool in accordance with a second embodiment of the present invention.

In a second embodiment, a pinhole structure may also be designed to measure the wave-front aberration for an EUV inspection tool. FIG. 5 is a side view representation of a pinhole structure 500 for measuring the wave-front aberration of an EUV inspection tool in accordance with a second embodiment of the present invention. As shown, the pinhole structure 500 includes a pinhole 508 formed from an absorber pattern 506. The absorber pattern is formed over a thin ML reflector 504, which may be formed over a substrate 502. The substrate may be formed of any material since the light never sees the substrate. The absorber pattern 506 may be formed by any suitable lithography process, for example, as described above.

In this example, the absorber material may be selected to be as highly absorbing of EUV light as possible. The same TaN absorber material as used in the EUV fabrication reticle may be used in the pinhole structure. However, this embodiment does not have to be limited to the same material as the actual fabrication reticle. For instance, the absorber material may be formed out of absorber materials that have higher EUV absorbing properties than the absorber material used to fabricate EUV reticles, e.g., TaN. Example absorber material for the pinhole may include one or more of the following materials: nickel (Ni), chromium (Cr), platinum (Pt), etc.

A capping layer 508 may be deposited on top of the ML reflector 504 (before the absorber layer is deposited) to protect the ML reflector 504 from moisture and oxygen attacks. In a specific implementation, the capping layer 508 has a thickness of a few nanometers. The capping layer 508 may, for example, include Ru, Si, DLC or Pt.

The pinhole depth D and width W may be selected so as to minimize adverse optical effects, such as shadowing, that would affect the light that is reflected from the underlying ML reflector 504 from filling the pupil area. In one example, an absorber layer thickness D of about 50 nm (or less) works well. A pinhole width of about 40-100 works well.

Similar to the ML pillar embodiment, the ML reflector 504 of the pinhole structure may also be designed to support the angular bandwidth of the EUV inspection tool. Accordingly, the pinhole reflector 504 may have a reduced number of layer pairs as described above for the ML pattern of the ML pillar structure. For instance, the ML reflector 504 may be composed of two alternating low-absorbing materials with high refractive index contrast of Mo/Si bilayer and employ no more than about 10, such as 5, pairs of Mo/Si bilayer. The ML reflector 504 may also be formed from a reduced number of alternating layers of Ruthenium (Ru) and Si, a Ru layer and a Si layer, a Mo layer and a Si layer interfaced with a carbon (C) based barrier layer, etc.

Although the illustrated embodiments are described as either round pillar structures or round holes, other shapes are contemplated. Any suitable type of ML stack/pillar or pinhole structure may be used to measure the wave-front aberration across the pupil area. By way of examples, the ML stack/pillar structure can be a cube, oval, etc. Likewise, the pinhole structure can be a cube shaped hole or via, rectangular shaped trench, oval, etc. In one embodiment, the test pattern is comprised of a single ML pillar or pinhole structure for measuring across the entire pupil area. In other embodiments, the test pattern is comprised of multiple ML pillars and/or pinholes of different sizes or shapes that are together used to measure across the pupil.

Figure 6:
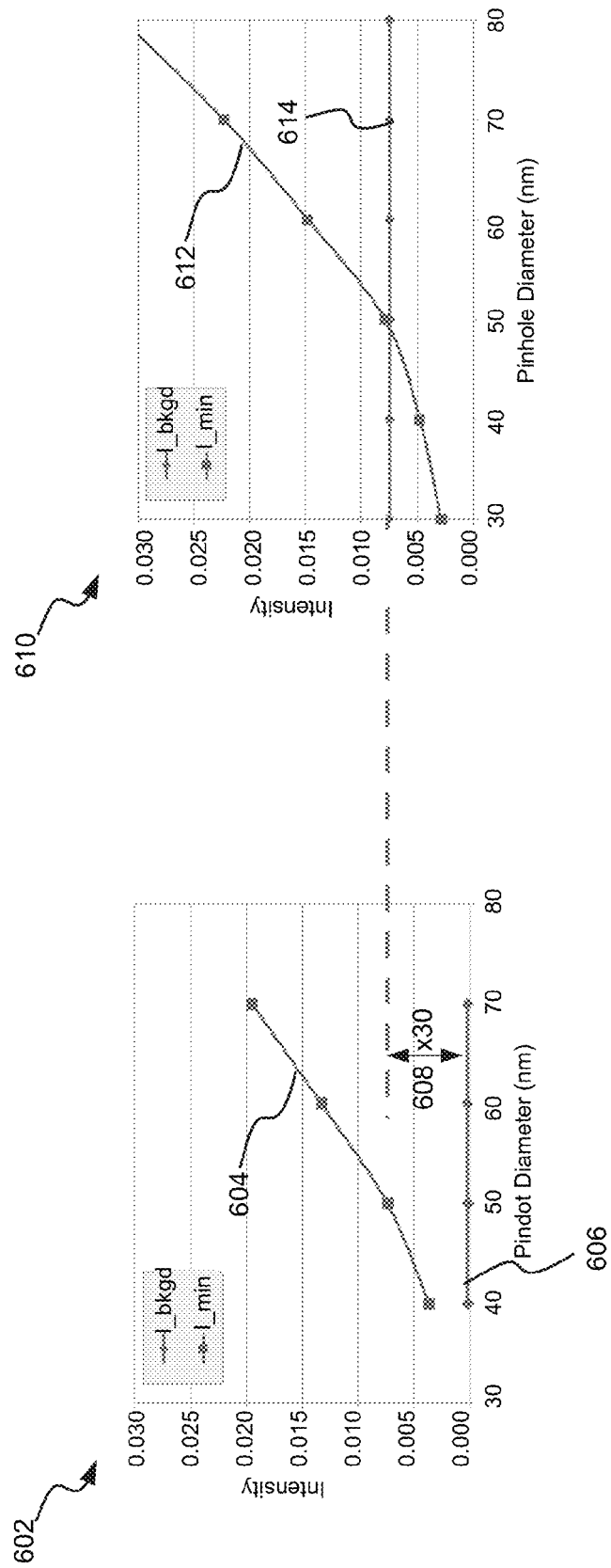
FIG. 6 shows comparisons of intensity contrast for differently sized ML pillar and pinhole test structures in accordance with one example implementation of the present invention.
Figure 7A:
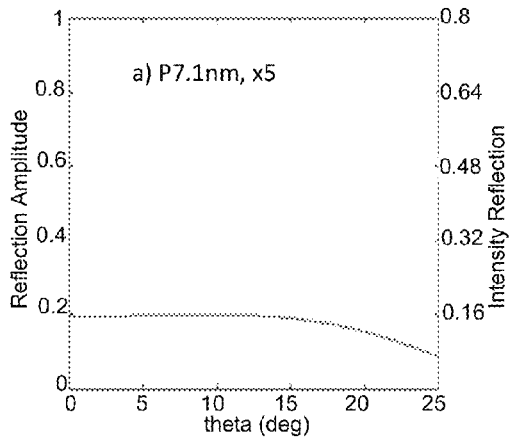
Figure 7D:
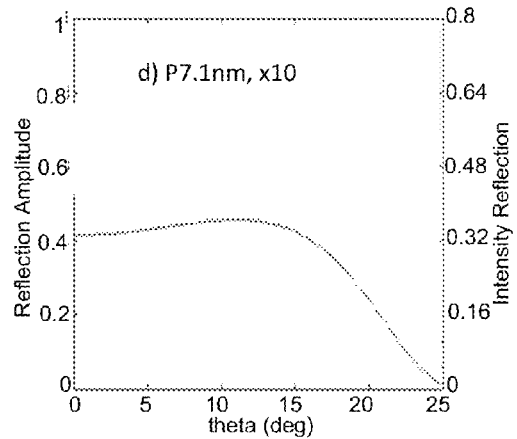
Figure 7B:
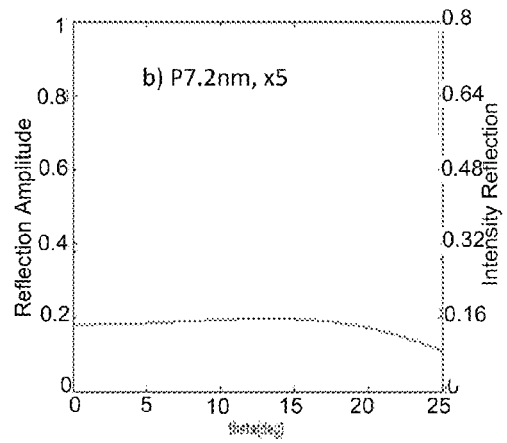
Figure 7E:
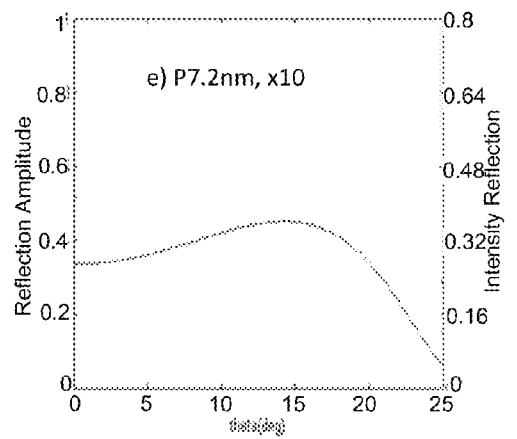
Figure 7C:
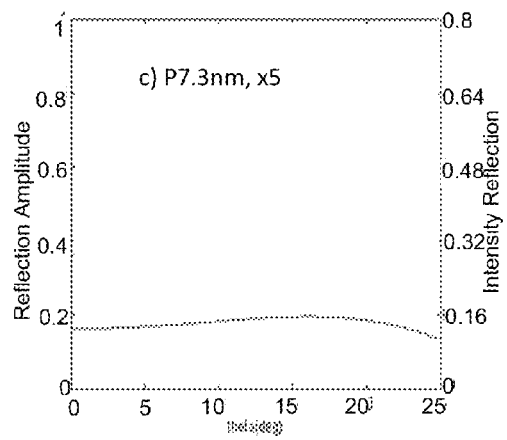
Figure 7F:
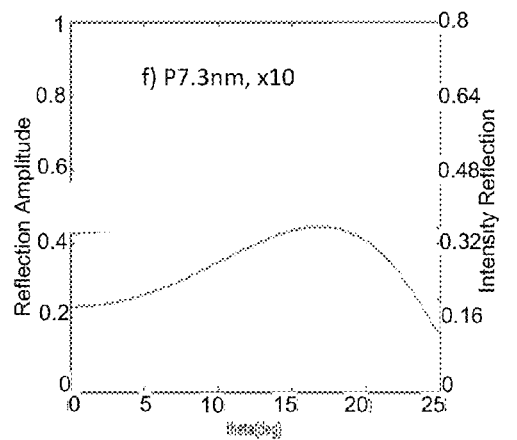

Both the ML pillar test pattern and pinhole provide contrast between the test structure and the surrounding background. FIG. 6 shows comparisons of intensity contrast for differently sized ML pillar test structures and pinhole structures in accordance with one example implementation of the present invention. Graph 602 corresponds to a ML pillar structure, while graph 610 corresponds to a pinhole structure. The pinhole structure of FIG. 6 was formed from a 50 nm thick TaN absorber material, which is a common absorber material seen in EUV reticles. The image intensity of the test feature (ML pillar or pinhole) at certain defocus is used as a reference. Both designs are equipped with the same thin multilayer reflector which gives similar brightness intensity of the test feature in the image for a given feature diameter size (curves 604 and 612). For a good uniform pupil fill, feature size of 50 nm or less is the size of interest.

Graph 602 shows a ML pillar intensity curve 604 (each point denoted by squares) and its corresponding background intensity curve 606 (each point denoted as diamonds) as a function of ML pillar diameter (nm). Similarly, graph 610 shows a pinhole intensity curve 612 (each point denoted by squares) and its corresponding background intensity curve 614 (each point denoted as diamonds) as a function of pinhole diameter (nm).

Each intensity graph shows the contrast between the ML pillar/pinhole structure's intensity as compared to the corresponding background intensity. As shown, the contrast between the ML pillar and its background intensity increases as the ML pillar size increases, and there appears to be a clear distinction between the ML pillar and background intensity. The pinhole design, however, shows the background intensity being equal to the pinhole structure intensity for pinhole dimensions close to 50 nm. Background intensity of the pinhole design is as high as or even higher than the signal intensity pinhole structure for dimensions less than 50 nm, resulting in poor signal-to-noise ratio and image artifact due to an interference effect. In contrast, the ML pillar design based on certain embodiments of this invention offers an additional 30× suppression of the background intensity, providing a much cleaner image. It allows further shrinkage of the feature size if needed without compromising the image quality.

The pinhole image contrast can be improved by using different absorber materials, which result in lower background intensity. Additionally, increasing the thickness of the absorber material may improve contrast and suppress background noise.

Certain embodiments of the diagnostic test structures provide increased angular bandwidth for measuring the wavefront aberrations of a EUV inspection tool. That is, the reflected light is substantially uniform across the pupil or at different collected angles. Certain embodiments of the present invention provide a ML pillar or pinhole structure that can be imaged with the EUV optics of the inspection tool so as to substantially fill the pupil area, which is typically larger than the NA of the photolithography system that uses the EUV reticle to fabricate a semiconductor device. That is, the NA at the reticle plane of the inspection system is often considerable greater than the NA at the reticle plane of the lithography system, which would result in differences between test inspection images and actual printed images. For instance, the NA of the EUV actinic inspector for inspecting a EUV mask can be greater than 0.1.

FIGS. 7A-7G show the calculated angle-resolved reflectivity curves for various Mo/Si multilayer designs that may be used in embodiments of the current invention. Each curve in these graphs represents a reflectivity of unpolarized EUV light at 13.5 nm wavelength. Each reflectivity curve is plotted as a function of angles of incidence.

Figure 7G:
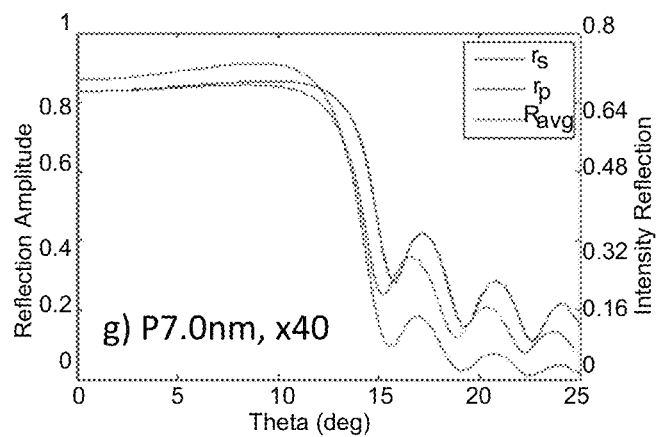
FIGS. 7A-7G show the calculated angle-resolved reflectivity curves for various Mo/Si multilayer designs that may be used in embodiments of the current invention.

FIG. 7G shows the intensity as a function of angle of incidence across the pupil for a test structure formed from typical number of bilayers that is equal to 40 with a 7.0 nm pitch. The reflectivity values are relatively flat for some of the angles (below 13 degrees). However, the reflectivity drops off steeply and is not uniform at angles that are greater than 13 degrees. The bandwidth of an EUV inspection system is typically much wider than the range shown in FIGS. 7A-7G.

FIGS. 7A-7F show other test structures with thinner ML structures. Among them, design (c) in FIG. 7C with 5 pairs of Mo/Si bilayer and a period of 7.3 nm provides almost flat reflectivity response for the angle range of 0-25 degrees. This reflectivity response is in contrast to the conventional multilayer design (g) of FIG. 7G with 40 pairs of Mo/Si bilayer and a period of 7.0 nm which has a sharp cutoff approximately at 13 degree. The trade-off of design (c) with 5 bilayers and pitch 7.3 nm is the reduction of peak reflectivity by almost 4×. This peak reduction is typically considered affordable for metrology purposes as accuracy, rather than throughput, is of higher priority. Increasing the number of bilayers from 5 to 10 recovers about half of the peak reflectivity loss (see FIGS. 7D, 7E, and 7F). However, increasing the bilayer count also reduces the multilayer bandwidth, which can be seen from the reflectivity fall-off towards larger angles. A higher ML count of 10 may still have better contrast than the design (g) of FIG. 7G with 40 bilayers.

In certain thin bilayer ML ML pillar or pinhole test structures the bilayers (Mo/Si) have a uniform periodicity. In alternative embodiments, the bilayers are non-periodic. The thickness of each bilayer can be optimized so as to result in a wider angle bandwidth or a particular bandwidth. Said in another way, each bilayer thickness can be optimized to further optimize pupil fill and/or peak reflectivity. A non-periodic design varies the thickness of Mo and Si in each pair of bilayer, as opposed to simply repeating a single copy.

FIG. 8A-8F illustrate various pupil images formed with ML pillar or pinhole structure embodiments of the present invention. Specifically, these images illustrate a comparison of the test feature diffraction pupil fill of an etched thin ML pillar design in FIGS. 8C and 8F, as compared with a thick ML pinhole design in FIGS. 8A and 8D, as well as an improved thin ML pinhole design with thin multilayer reflector in FIGS. 8B and 8E for two set of features sizes (D=40 nm and 50 nm). For example, FIG. 8A shows a pinhole image with different intensity portions labeled as red, orange, and yellow for contours at different pupil intensities. These different contours are also imaged relative to the pupil aperture 802. An intensity graph as a function of pupil position is also shown for each of the different pinhole or ML pillar structures (e.g., graphs 804a-804o).

In general, FIGS. 8A-8F show the modeled test feature diffraction pupil fill for various designs when illuminated coherently near the center of the projection optics aperture. In the conventional design of FIGS. 8A and 8D, a ML reflector with 40 pairs of Mo/Si bilayer and a 50 nm thick TaN absorber are used. For feature diameter of 50 nm(a) and 40 nm(d), the pupil fill is far from uniform, heavily modulated by the bandwidth of the multilayer, therefore, resulting in a largely asymmetric intensity contours relative to the pupil aperture 802. By switching to a thin multilayer pinhole design as shown in FIG. 8B, the pupil fill improves due to larger multilayer bandwidth for feature diameter of 50 nm. However, as the feature size continues to shrink to 40 nm, the pupil fill becomes worse again as a result of the shadowing effect associated with off-axis illumination as shown in FIG. 8E. The etched ML pillar design as illustrated in FIGS. 8C and 8F are exempted from these drawbacks. These thin ML pillar designs offer a more uniform and symmetric pupil fill for feature sizes at both 50 nm and 40 nm. On top of that, as discussed previously, this design provides a much cleaner background.

In general, wave-front aberration can be measured by a phase retrieval method, based on the images captured on the test structures described herein, using the inspection imaging system, whose wave-front is to be measured. The idealized, non-aberrated image can be calculated and compared to the measured image. A phase retrieval technique may be used, such as the technique described in P. Dirksen et al, "Characterization of a projection lens using the extended Nijboer-Zernike approach" Proceedings of SPIE v4691, 1392 (2002), which paper is incorporated herein by reference.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. For example, the EUV test structure described herein can work with other EUV inspection systems, such as to measure the wave-front aberration on EUV defect review systems. Accordingly, the present embodiments are to be considered as illustrative and not restrictive, and the invention is not to be limited to the details given herein.

What is claimed is:

1. A test structure for measuring wave-front aberration of an extreme ultraviolet (EUV) inspection system, comprising:
a substrate formed from a material having substantially no reflectivity for EUV light; and
a multilayer (ML) stack portion formed over only one or more portions of a top surface of the substrate and comprising a plurality of alternating pairs of layers having different refractive indexes so as to reflect EUV light, wherein the ML stack portion is arranged over only the one or more portions of the top surface of the substrate so that at least a portion of the top surface of the substrate is exposed without being covered by the ML stack portion.

2. The test structure of claim 1, wherein each pair comprises (i) a molybdenum (Mo) layer and a silicon (Si) layer, (ii) a Ru layer and a Si layer, or (iii) a Mo layer and a Si layer interfaced with a carbon (C) based barrier layer.

3. The test structure of claim 1, further comprising a capping layer over the ML stack portion formed from a material that prevents oxidation of the ML stack portion and is substantially transparent, wherein the capping layer is comprised of Ru, diamond-like carbon (DLC), Si or platinum (Pt).

4. The test structure of claim 1, wherein the alternating pairs of layers of the ML stack portion are non-periodic in relative thicknesses and each alternating pair has a thickness that is optimized so that EUV light diffracted from the test structure substantially fills an entrance pupil area of the inspection system and/or has an optimized peak reflectivity.

5. The test structure of claim 1, wherein a count of the pairs is equal to or less than ten.

6. The test structure of claim 1, wherein a count of the pairs is equal to or less than five.

7. The test structure of claim 1, wherein a period of the ML stack portion is between about 7 and 7.5 nm.

8. The test structure of claim 1, wherein the ML stack portion has a composition that provides a high contrast between the ML stack portion and the substrate when imaged with EUV light.

9. The test structure of claim 1, wherein the ML stack portion has a thickness equal to or less than 75 nm.

10. The test structure of claim 1, wherein the substrate has a refractive index that results in reflectivity of EUV light that is less than 0.1%.

11. The test structure of claim 1, further comprising a conformal layer over the ML stack portion's top and sidewalls, wherein the conformal layer has a low diffusivity for oxygen and is substantially transparent, wherein the conformal layer is comprised of Ru, boron (B), DLC, SiO2 or Si3N4.

12. The test structure of claim 1, wherein the ML stack portion is a pillar that has a diameter less than 100 nm.

13. A method of forming a test structure for measuring wave-front aberration of an extreme ultraviolet (EUV) inspection system, comprising:
over a top surface of a substrate, depositing a plurality of alternating pairs of a first layer and a second layer that are reflective to EUV light; and
patterning the plurality of alternating pairs of the first layer and the second layer to form a multilayer (ML) stack portion over only one or more portions of the top surface of the substrate so that at least a portion of the top surface of the substrate remains exposed without being covered by the ML stack portion.

14. An inspection system, comprising:
one or more illumination elements for directing an EUV incident beam onto a test structure comprising a substrate formed from a material having substantially no reflectivity for EUV light and a multilayer (ML) stack portion formed on the substrate and comprising a plurality of alternating pairs of layers having different refractive indexes so as to reflect EUV light, wherein the pairs have a count equal to or less than 15;

one or more imaging elements for detecting an output beam from the test structure and generating an image or signal based on the output beam, wherein the output beam emanates from the test structure in response to the incident beam on the test structure; and a processor configured for analyzing the image or signal to measure wave-front aberration substantially across a pupil of the inspection system.

15. The inspection system of claim 14 having a numerical aperture (NA) greater than 0.1.

16. The inspection system of claim 14, wherein each pair comprises (i) a molybdenum (Mo) layer and a silicon (Si) layer, (ii) a Ru layer and a Si layer, or (iii) a Mo layer and a Si layer interfaced with a carbon (C) based barrier layer.

17. The inspection system of claim 14, wherein the alternating pairs of layers of the ML stack portion are non-periodic and each alternating pair has a thickness that is optimized so that EUV light diffracted from the test structure substantially fills an entrance pupil area of the inspection system and/or has an optimized peak reflectivity.

18. The inspection system of claim 14, wherein the count of the pairs is equal to or less than 10.

19. The inspection system of claim 14, wherein the count of the pairs is equal to or less than 5.

20. The inspection system claim 14, wherein a period of the ML stack portion is between about 7 and 7.5 nm.

21. The inspection system of claim 14, wherein the ML stack portion has a composition that provides a high contrast between the ML stack portion and the substrate when imaged with EUV light.

22. The inspection system of claim 14, wherein the ML stack portion has a thickness equal to or less than 75 nm.

23. The inspection system of claim 14, wherein the substrate has a refractive index that results in reflectivity of EUV light that is less than 0.1%.

24. The inspection system of claim 14, the test structure further comprising a conformal layer over the ML stack portion's top and sidewalls, wherein the conformal layer has a low diffusivity for oxygen and is substantially transparent, wherein the conformal layer is comprised of Ru, boron (B), DLC, $SiO_2$ or $Si_3N_4$.

25. The inspection system of claim 14, wherein the ML stack portion is a pillar that has a diameter less than 100 nm.

* * * * *